(12) United States Patent
Nomaru

(10) Patent No.: US 7,459,655 B2
(45) Date of Patent: Dec. 2, 2008

(54) LASER BEAM PROCESSING MACHINE

(75) Inventor: Keiji Nomaru, Tokyo (JP)

(73) Assignee: Disco Corporation, Tokyo (JP)

( * ) Notice: Subject to any disclaimer, the term of this patent is extended or adjusted under 35 U.S.C. 154(b) by 434 days.

(21) Appl. No.: 11/113,156

(22) Filed: Apr. 25, 2005

(65) Prior Publication Data

US 2005/0236381 A1   Oct. 27, 2005

(30) Foreign Application Priority Data

Apr. 27, 2004   (JP) .............................. 2004-131350

(51) Int. Cl.
 B23K 26/06 (2006.01)
 B23K 26/08 (2006.01)
(52) U.S. Cl. .............................. 219/121.78; 219/121.74
(58) Field of Classification Search ................................
  219/121.63–121.74, 121.78–121.81; 359/850, 359/861
 See application file for complete search history.

(56) References Cited

U.S. PATENT DOCUMENTS

| | | | | |
|---|---|---|---|---|
| 4,806,728 A * | 2/1989 | Salzer et al. | ........... | 219/121.63 |
| 5,115,355 A * | 5/1992 | Dunn | ........................ | 359/876 |
| 5,327,280 A * | 7/1994 | Morimoto | .................... | 359/216 |
| 5,446,565 A * | 8/1995 | Komma et al. | ........... | 369/44.23 |
| 5,561,544 A * | 10/1996 | Macken | ....................... | 359/201 |
| 5,875,167 A * | 2/1999 | Katayama | .............. | 369/112.07 |
| 6,353,203 B1 * | 3/2002 | Hokodate et al. | ...... | 219/121.67 |
| 6,417,485 B1 * | 7/2002 | Troitski | ................. | 219/121.69 |
| 6,676,265 B2 * | 1/2004 | Carter | ........................ | 359/858 |
| 6,727,462 B2 * | 4/2004 | Mayer | .................... | 219/121.73 |

FOREIGN PATENT DOCUMENTS

| | | | | |
|---|---|---|---|---|
| JP | 355077042 A | * | 6/1980 | |
| JP | 363180801 A | * | 7/1988 | |
| JP | 402015887 A | * | 1/1990 | |
| JP | 406214187 A | * | 8/1994 | |
| JP | 408122272 A | * | 5/1996 | |
| JP | 408329488 A | * | 12/1996 | |
| JP | 02000348370 A | * | 12/2000 | |
| JP | 02002126888 A | * | 5/2002 | |
| JP | 3408805 | | 3/2003 | |
| JP | 2003-168655 | | 6/2003 | |
| JP | 2004-117496 | | 3/2004 | |

OTHER PUBLICATIONS

U.S. Appl. No. 11/098,409, filed Apr. 5, 2005, entitled Laser Beam Processing Machine.

* cited by examiner

Primary Examiner—Samuel M Heinrich
(74) Attorney, Agent, or Firm—Smith, Gambrell & Russell, LLP

(57) ABSTRACT

A laser beam processing machine comprising a chuck table for holding a workpiece and a laser beam application means comprising a laser beam oscillation means and a condenser having an objective lens for converging a laser beam oscillated by the laser beam oscillation means to apply it to the workpiece held on the chuck table, wherein a first lens for transmitting a laser beam oscillated by the laser beam oscillation means, a second lens for transmitting a laser beam that has passed through the first lens, and an optical path length changing means for changing the length of the optical path between the first lens and the second lens are interposed between the laser beam oscillation means and the objective lens.

3 Claims, 10 Drawing Sheets

LASER BEAM PROCESSING MACHINE

FIELD OF THE INVENTION

The present invention relates to a laser beam processing machine for carrying out laser beam processing on a plate-like workpiece held on a chuck table along predetermined processing lines.

DESCRIPTION OF THE PRIOR ART

In the production process of a semiconductor device, a plurality of areas are sectioned by dividing lines called "streets" arranged in a lattice pattern on the front surface of a substantially disk-like semiconductor wafer, and a circuit such as IC, LSI or the like is formed in each of the sectioned areas. Individual semiconductor chips are manufactured by cutting this semiconductor wafer along the dividing lines to divide it into the areas having circuit formed thereon. An optical device wafer comprising gallium nitride-based compound semiconductors or the like laminated on the front surface of a sapphire substrate is also cut along dividing lines to be divided into individual optical devices such as light emitting diodes or laser diodes, which are widely used in electric equipment.

Cutting along the dividing lines of the above semiconductor wafer or optical device wafer is generally carried out by a cutting machine called "dicer". This cutting machine comprises a chuck table for holding a workpiece such as a semiconductor wafer or optical device wafer, a cutting means for cutting the workpiece held on the chuck table, and a cutting-feed means for moving the chuck table and the cutting means relative to each other. The cutting means has a spindle unit, which comprises a rotary spindle, a cutting blade mounted onto the spindle and a drive mechanism for rotary-driving the rotary spindle. The cutting blade comprises a disk-like base and an annular cutting-edge which is mounted onto the side wall outer peripheral portion of the base, and is formed as thick as about 20 µm by fixing diamond abrasive grains having a diameter of about 3 µm to the base by electroforming.

Since a sapphire substrate, silicon carbide substrate, etc. have high Mohs hardness, cutting with the above cutting blade is not always easy. Further, since the cutting blade has a thickness of about 20 µm, the dividing lines for sectioning devices must have a width of about 50 µm. Therefore, in the case of a device measuring about 300 µm ×300 µm, the area ratio of the streets to the wafer becomes 14%, thereby reducing productivity.

Meanwhile, as a means of dividing a plate-like workpiece such as a semiconductor wafer, a laser beam processing method for applying a pulse laser beam capable of passing through the workpiece with its focusing point set to the inside of the area to be divided is also attempted nowadays. In the dividing method making use of this laser beam processing technique, the workpiece is divided by applying a pulse laser beam of a wavelength of, for example, 1,064 nm, which is capable of passing through the workpiece, from one side of the workpiece with its focusing point set to the inside to continuously form a deteriorated layer along the dividing lines in the inside of the workpiece and exerting external force along the dividing lines whose strength has been reduced by the formation of the deteriorated layers. This method is disclosed by Japanese Patent No. 3408805.

When the plate-like workpiece such as a semiconductor wafer has an undulate surface and is not uniform in thickness, the deteriorated layers cannot be formed to a predetermined depth uniformly because of the refractive index at the time of application of a laser beam. Therefore, to form deteriorated layers to a predetermined depth uniformly in the inside of the semiconductor wafer, the unevenness of the area to which a laser beam is to be applied must be detected beforehand, and the laser beam application means must be adjusted to follow this unevenness.

Laser beam processing in which a laser beam is applied with its focusing point set to the inside of a plate-like workpiece to mark the inside of the workpiece is also implemented. However, to mark the inside of the workpiece to a predetermined depth, the laser beam application means must be adjusted to follow the unevenness of the surface of the workpiece.

To solve the above problem, JP-A 2003-168655 discloses a dicing machine which is provided with a height position detection means for detecting the height position of a workpiece placed on a work table to detect the height position of the cutting area of the workpiece through the height position detection means and make a cutting area height map, so that a cutting position of a cutting blade is controlled based on this map.

In the technology disclosed by the above publication, the cutting area height map is first prepared by detecting the height position of the cutting area of the workpiece by using the height position detection means and then, cutting processing is carried out while the cutting position of the cutting blade is controlled based on the map obtained. Since the height position detection step and the cutting step are separated from each other, this technology is not efficient in terms of productivity.

Under the circumstances, the applicant of the present application proposes as Japanese Patent Application No. 2004-117496 a laser beam processing machine capable of carrying out laser beam processing at a desired position of a plate-like workpiece efficiently even when the plate-like workpiece is not uniform in thickness. In this laser beam processing machine, the height position of a portion, to which a laser beam is to be applied from a condenser, of a workpiece held on a chuck table is detected by a height position detection means, so that the condenser is adjusted by being moved in a direction perpendicular to the holding surface of the chuck table based on the detection signal of the height position detection means.

In the above laser beam processing machine, however, it is difficult to move the condenser quickly in response to the detection signal from the height position detection means. That is, as the condenser comprises a set of lenses (objective condenser lenses) and therefore weighs about 1 kg and has a large inertia force, it is difficult to move it quickly. When the condenser having large inertia force is moved in the vertical direction, a problem arises that subtle vibration occurs, thereby affecting the laser beam processing accuracy.

SUMMARY OF THE INVENTION

It is an object of the present invention to provide a laser beam processing machine capable of carrying out processing at a desired position of a plate-like workpiece efficiently even when the workpiece is not uniform in thickness.

According to the present invention, the above object is attained by a laser beam processing machine comprising a chuck table for holding a workpiece, a laser beam application means having a laser beam oscillation means and a condenser equipped with an objective lens for converging a laser beam oscillated by the laser beam oscillation means to apply it to the workpiece held on the chuck table, and a processing-feed means for moving the chuck table and the laser beam application means relative to each other in a processing-feed direction, wherein a focusing point shifting means for shifting the position of the focusing point of the laser beam converged by the objective lens is arranged between the laser beam oscillation means and the objective lens; and the focusing point shifting means comprises a first lens for transmitting the laser beam oscillated by the laser beam oscillation means, a second lens for transmitting a laser beam that has passed through the first lens, and an optical path length changing means for changing the length of an optical path between the first lens and the second lens.

The above optical path length changing means is constituted by a first deflection mirror means which is composed of a first mirror for reflecting and deflecting a laser beam that has passed through the first lens, a second mirror for reflecting and deflecting a laser beam reflected by the first mirror and an angle adjusting actuator for adjusting the setting angles of the first mirror and the second mirror and a second deflection mirror means which is composed of a third mirror for reflecting and deflecting a laser beam reflected by the second mirror of the first deflection mirror means, a fourth mirror for reflecting and deflecting a laser beam reflected by the third mirror and an angle adjusting actuator for adjusting the setting angles of the third mirror and the fourth mirror. The first mirror and the second mirror of the first deflection mirror means are arranged parallel to each other with a predetermined interval therebetween, and the third mirror and the fourth mirror of the second deflection mirror means are arranged parallel to each other with a predetermined interval therebetween.

The laser beam processing machine comprises a height position detection means for detecting the height of the application position of a laser beam applied from the condenser of the top surface of the workpiece held on the chuck table and a control means for controlling the angle adjusting actuators based on a height position detection signal from the height position detection means.

In the laser beam processing machine according to the present invention, since the position of the focusing point of a laser beam converged by the objective lens can be changed by changing the length of the optical path between the first lens and the second lens through the above optical path length changing means, processing can be carried out at a desired position of the workpiece efficiently even when the workpiece is not uniform in thickness.

DETAILED DESCRIPTION OF THE PREFERRED EMBODIMENT

A preferred embodiment of the present invention will be described in detail hereinunder with reference to the accompanying drawings.

Figure 1:
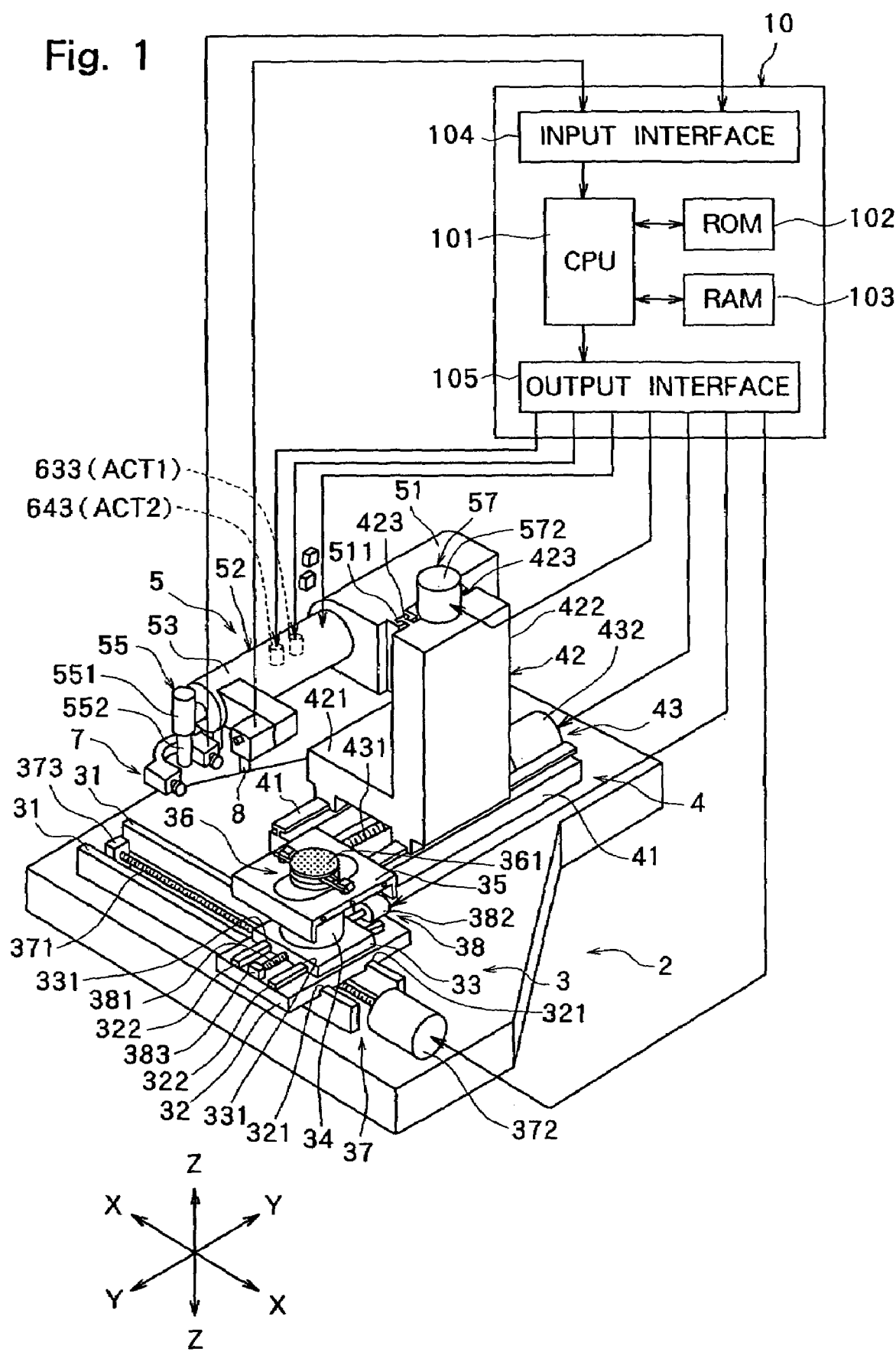
FIG. 1 is a perspective view of a laser beam processing machine constituted according to the present invention.

FIG. 1 is a perspective view of a laser beam processing machine constituted according to the present invention. The laser beam processing machine shown in FIG. 1 comprises a stationary base 2, a chuck table mechanism 3 for holding a plate-like workpiece, which is mounted on the stationary base 2 in such a manner that it can move in a processing-feed direction indicated by an arrow X, a laser beam application unit support mechanism 4 mounted on the stationary base 2 in such a manner that it can move in an indexing direction indicated by an arrow Y perpendicular to the direction indicated by the arrow X, and a laser beam application unit 5 mounted on the laser beam application unit support mechanism 4 in such a manner that it can move in a focusing point position adjusting direction indicated by an arrow Z.

The above chuck table mechanism 3 comprises a pair of guide rails 31 and 31 that are mounted on the stationary base 2 and arranged parallel to each other along the direction indicated by the arrow X, a first sliding block 32 mounted on the guide rails 31 and 31 in such a manner that it can move in the direction indicated by the arrow X, a second sliding block 33 mounted on the first sliding block 32 in such a manner that it can move in the direction indicated by the arrow Y, a support table 35 supported on the second sliding block 33 by a cylindrical member 34, and a chuck table 36 as workpiece holding means. This chuck table 36 has a workpiece holding surface 361 made of a porous material so that a disk-like semiconductor wafer as the plate-like workpiece is held on the workpiece holding surface 361 by a suction means that is not shown. The chuck table 36 is turned by a pulse motor (not shown) installed in the cylindrical member 34.

The above first sliding block 32 has, on its undersurface, a pair of to-be-guided grooves 321 and 321 to be fitted to the above pair of guide rails 31 and 31 and is, on its top surface, provided with a pair of guide rails 322 and 322 formed parallel to each other in the direction indicated by the arrow Y. The first sliding block 32 constituted as described above is so constituted as to be moved in the direction indicated by the arrow X along the pair of guide rails 31 and 31 by fitting the to-be-guided grooves 321 and 321 to the pair of guide rails 31 and 31, respectively. The chuck table mechanism 3 in the illustrated embodiment has a processing-feed means 37 for moving the first sliding block 32 along the pair of guide rails 31 and 31 in the direction indicated by the arrow X. The processing-feed means 37 comprises a male screw rod 371, which is arranged between the above pair of guide rails 31 and 31 in parallel to them, and a drive source such as a pulse motor 372 for rotary-driving the male screw rod 371. The male screw rod 371 is, at its one end, rotatably supported to a bearing block 373 fixed on the above stationary base 2 and is, at its other end, transmission-coupled to the output shaft of the above pulse motor 372 by a speed reducer that is not shown. The male screw rod 371 is screwed into a threaded through-hole formed in a female screw block (not shown) projecting from the undersurface of the center portion of the first sliding block 32. Therefore, by driving the male screw rod 371 in a normal direction or reverse direction with the pulse motor 372, the first sliding block 32 is moved along the guide rails 31 and 31 in the processing-feed direction indicated by the arrow X.

The above second sliding block 33 has, on its undersurface, a pair of to-be-guided grooves 331 and 331 to be fitted to the pair of guide rails 322 and 322 provided on the top surface of the above first sliding block 32, and is so constituted as to be moved in the direction indicated by the arrow Y by fitting the to-be-guided grooves 331 and 331 to the pair of guide rails 322 and 322, respectively. The chuck table mechanism 3 in the illustrated embodiment has a first indexing-feed means 38 for moving the second sliding block 33 in the direction indicated by the arrow Y along the pair of guide rails 322 and 322 provided on the first sliding block 32. The first indexing-feed means 38 comprises a male screw rod 381, which is arranged between the above pair of guide rails 322 and 322 in parallel to them, and a drive source such as a pulse motor 382 for rotary-driving the male screw rod 381. The male screw rod 381 is, at its one end, rotatably supported to a bearing block 383 fixed on the top surface of the above first sliding block 32 and is, at its other end, transmission coupled to the output shaft of the above pulse motor 382 by a speed reducer that is not shown. The male screw rod 381 is screwed into a threaded through-hole formed in a female screw block (not shown) projecting from the undersurface of the center portion of the second sliding block 33. Therefore, by driving the male screw rod 381 in a normal direction or reverse direction with the pulse motor 382, the second sliding block 33 is moved along the guide rails 322 and 322 in the indexing-feed direction indicated by the arrow Y.

The above laser beam application unit support mechanism 4 comprises a pair of guide rails 41 and 41 that are mounted on the stationary base 2 and are arranged parallel to each other in the direction indicated by the arrow Y and a movable support base 42 mounted on the guide rails 41 and 41 in such a manner that it can move in the direction indicated by the arrow Y. This movable support base 42 is composed of a movable support portion 421 movably mounted on the guide rails 41 and 41 and a mounting portion 422 mounted on the movable support portion 421. The mounting portion 422 is provided with a pair of guide rails 423 and 423 extending in the direction indicated by the arrow Z on one of its flanks. The laser beam application unit support mechanism 4 in the illustrated embodiment has a second indexing-feed means 43 for moving the movable support base 42 along the pair of guide rails 41 and 41 in the direction indicated by the arrow Y. This second indexing-feed means 43 comprises a male screw rod 431, which is arranged between the above pair of guide rails 41 and 41 in parallel to them and a drive source such as a pulse motor 432 for rotary-driving the male screw rod 431. The male screw rod 431 is, at its one end, rotatably supported to a bearing block (not shown) fixed on the above stationary base 2 and is, at its other end, transmission-coupled to the output shaft of the above pulse motor 432 by a speed reducer that is not shown. The male screw rod 431 is screwed into a threaded through-hole formed in a female screw block (not shown) projecting from the undersurface of the center portion of the movable support portion 421 constituting the movable support base 42. Therefore, by driving the male screw rod 431 in a normal direction or reverse direction with the pulse motor 432, the movable support base 42 is moved along the guide rails 41 and 41 in the indexing-feed direction indicated by the arrow Y.

The laser beam application unit 5 in the illustrated embodiment comprises a unit holder 51 and a laser beam application means 52 as a processing means secured to the unit holder 51. The unit holder 51 has a pair of to-be-guided grooves 511 and 511 to be slidably fitted to the pair of guide rails 423 and 423 on the above mounting portion 422, and is supported in such a manner that it can move in the direction indicated by the arrow Z by fitting the to-be-guided grooves 511 and 511 to the above guide rails 423 and 423, respectively.

Figure 2:
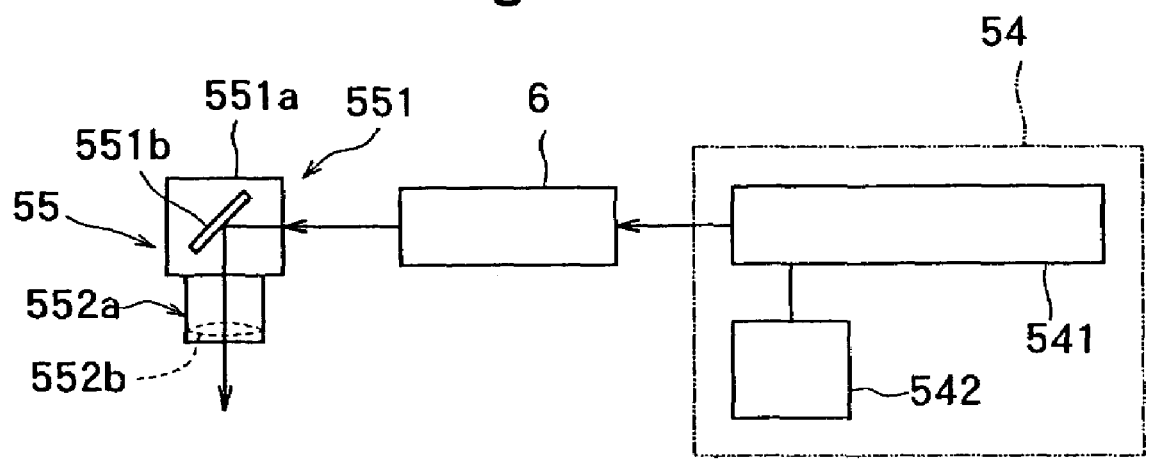
FIG. 2 is a block diagram schematically showing the constitution of a laser beam processing means provided in the laser beam processing machine shown in FIG. 1.

The illustrated laser beam application means 52 has a cylindrical casing 53 that is secured to the above unit holder 51 and extends substantially horizontally. The laser beam application means 52 has a pulse laser beam oscillation means 54 installed in the casing 53 as shown in FIG. 2 and a processing head 55 that is mounted onto the end of the casing 53 and applies a pulse laser beam oscillated by the pulse laser beam oscillation means 54 to the workpiece held on the above chuck table 36. The pulse laser beam oscillation means 54 is constituted by a pulse laser beam oscillator 541 composed of a YAG laser oscillator or YVO4 laser oscillator and a repetition frequency setting means 542 connected to the pulse laser beam oscillator 541.

The above processing head 55 comprises a deflection mirror means 551 and a condenser 552 mounted to the bottom of the deflection mirror means 551. The deflection mirror means 551 has a mirror case 551$a$ and a deflection mirror 551$b$ that is installed in the mirror case 551$a$. The deflection mirror 551$b$ deflects a laser beam oscillated from the above pulse laser beam oscillation means 54 in a downward direction, that is, toward the condenser 552 as shown in FIG. 2. The condenser 552 is constituted by a condenser case 552$a$ and a set of lenses (not shown) including an objective lens 552$b$, which is installed in the condenser case 552$a$.

Figure 3:
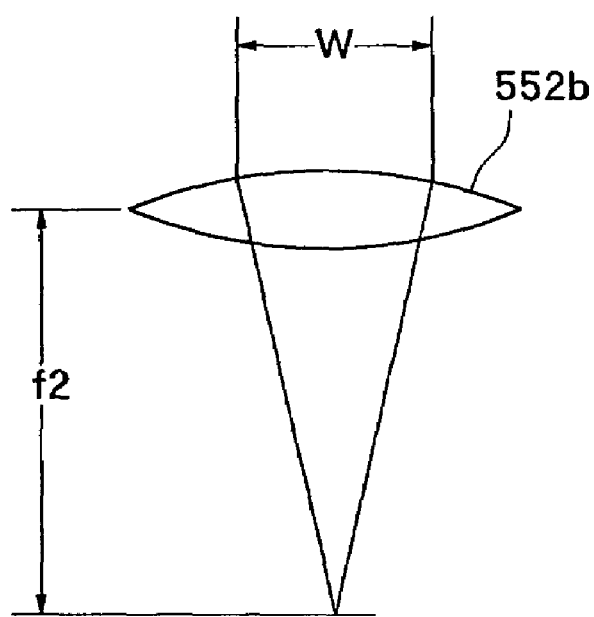
FIG. 3 is a schematic diagram showing the focusing spot diameter of a laser beam applied from the laser beam processing means shown in FIG. 2.

A laser beam oscillated from the above pulse laser beam oscillation means 54 is deflected at 90° by the deflection mirror 551$b$, reaches the condenser 552 and is applied to the workpiece held on the above chuck table 36 through the objective condenser lens 552$b$ of the condenser 552 at a predetermined focusing spot diameter D (focusing point). This focusing spot diameter D is defined by the expression D ($\mu$m)=$4 \times \lambda \times f2/(\pi \times W)$(wherein $\lambda$ is the wavelength ($\mu$m) of the pulse laser beam, W is the diameter (mm) of the pulse laser beam applied to the objective condenser lens 552b, and f2 is the focusing distance (mm) of the objective condenser lens 552b) when the pulse laser beam having a Gaussian distribution is applied through the objective condenser lens 552b of the condenser 552 as shown in FIG. 3.

The laser beam application means 52 in the illustrated embodiment has a focusing point shifting means 6 provided between the pulse laser beam oscillation means 54 and the processing head 55, that is, the condenser 552 as shown in FIG. 2. This focusing point shifting means 6 is installed in the above casing 53 and has the function of shifting the position of the focusing point of a laser beam to be converged by the above objective condenser lens 552b.

A first embodiment of the focusing point shifting means 6 will be described hereinunder with reference to FIG. 4 and FIG. 5.

Figure 4:
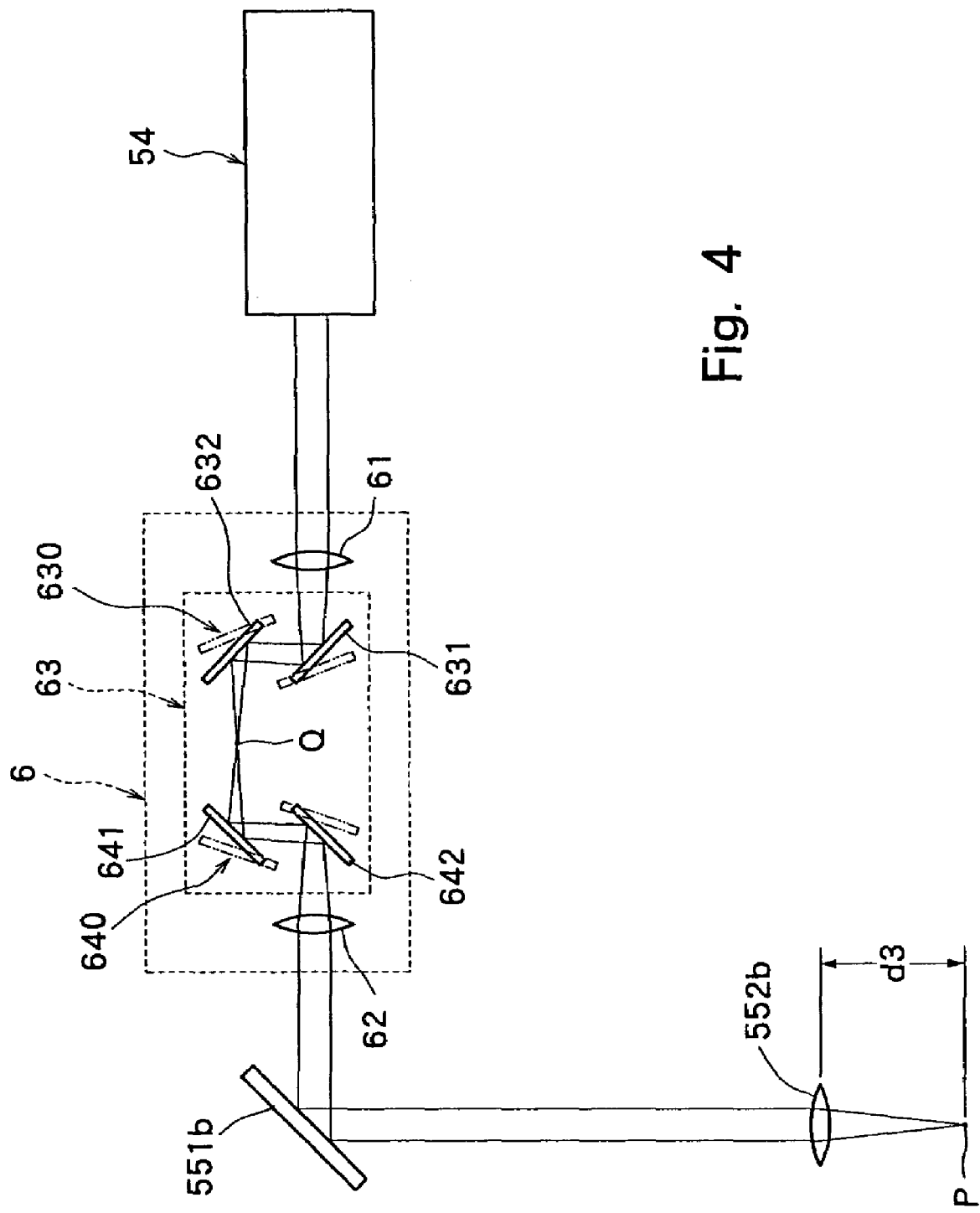
FIG. 4 is a schematic diagram showing a first embodiment of a focusing point shifting means provided in the laser beam processing machine shown in FIG. 1.
Figure 5:
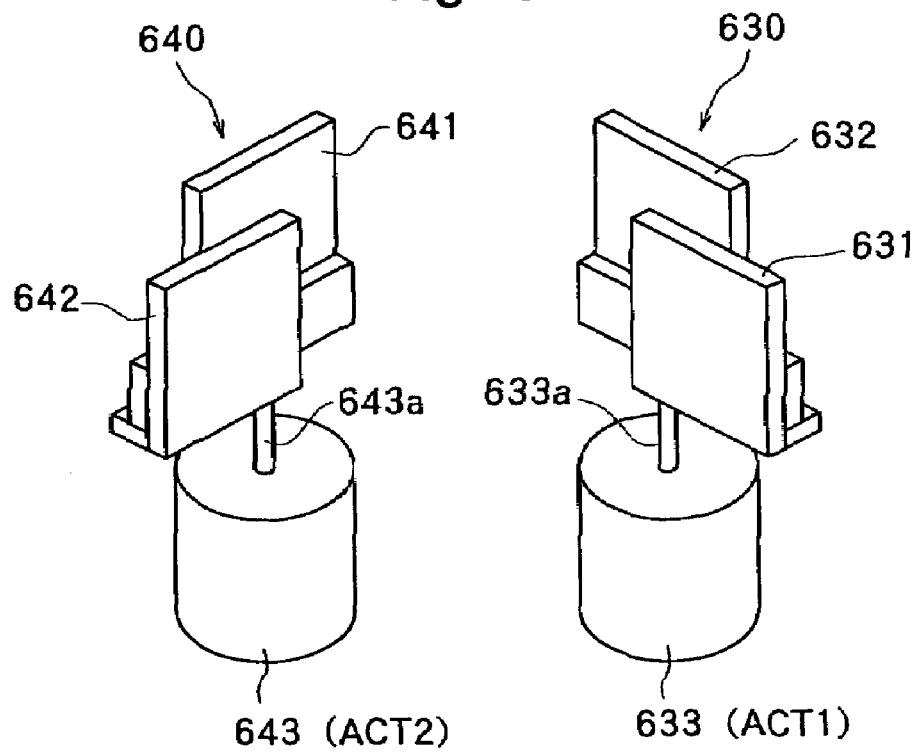
FIG. 5 is a perspective view of a first deflection mirror means and a second deflection mirror means constituting the focusing point shifting means shown in FIG. 4.

The focusing point shifting means 6 of the first embodiment shown in FIG. 4 and FIG. 5 comprises a first lens 61 for transmitting a laser beam oscillated by the above pulse laser beam oscillation means 54, a second lens 62 for transmitting a laser beam that has passed through the first lens 61 and an optical path length changing means 63 for changing the length of the optical path between the first lens 61 and the second lens 62. The optical path length changing means 63 comprises a first deflection mirror means 630 for reflecting and deflecting a laser beam that has passed through the first lens 61 and a second deflection mirror means 640 for reflecting and deflecting a laser beam that has been reflected and deflected by the first deflection mirror means 630, both of which are interposed between the first lens 61 and the second lens 62.

The first deflection mirror means 630 is constituted by a pair of a first mirror 631 and a second mirror 632, which are opposed to each other in parallel with a predetermined interval therebetween and an angle adjusting actuator (ACT1) 633 for adjusting the setting angles of the first mirror 631 and the second mirror 632. In the thus constituted first deflection mirror means 630, as shown in FIG. 4, the first mirror 631 reflects and deflects a laser beam that has passed through the first lens 61 toward the second mirror 632 which then reflects and deflects the laser beam that has been reflected and defected by the first mirror 631 toward the second deflection mirror means 640. The angle adjusting actuator 633 (ACT1) is composed of a galvano scanner in the embodiment shown in FIG. 5. The turning shaft 633a of the actuator 633 is transmission-connected to the joint between the pair of first mirror 631 and second mirror 632. This angle adjusting actuator 633 (ACT1) is controlled by a control means which will be described later to change the setting angles of the first mirror 631 and the second mirror 632 as shown by two-dot chain lines in FIG. 4.

The second deflection mirror means 640 is constituted by a third mirror 641 and a fourth mirror 642, which are opposed to each other in parallel with a predetermined interval therebetween and an angle adjusting actuator (ACT2) 643 for adjusting the setting angles of the third mirror 641 and the fourth mirror 642. In the thus constituted second deflection mirror means 640, as shown in FIG. 4, the third mirror 641 reflects and deflects a laser beam has been reflected and deflected by the second mirror 632 of the above first deflection mirror means 630 toward the fourth mirror 642 which then reflects and deflects a laser beam has been reflected and defected by the third mirror 641 toward the deflection mirror 551b of the above processing head 55. The angle adjusting actuator 643 is composed of a galvano scanner in the embodiment shown in FIG. 5. The turning shaft 643a of the actuator 643 is transmission-connected to the joint between the third mirror 641 and the fourth mirror 642. This angle adjusting actuator 643 (ACT2) is controlled by the later-described control means to change the setting angles of the third mirror 641 and the fourth mirror 642 as shown by two-dot chain lines in FIG. 4.

The focusing point shifting means 6 in the illustrated embodiment is constituted as described above, and the mechanism of shifting the position of the focusing point of a laser beam that is oscillated by the above pulse laser beam oscillation means 54 and converged by the objective condenser lens 552b of the above condenser 552 will be described hereinunder.

Figure 6:
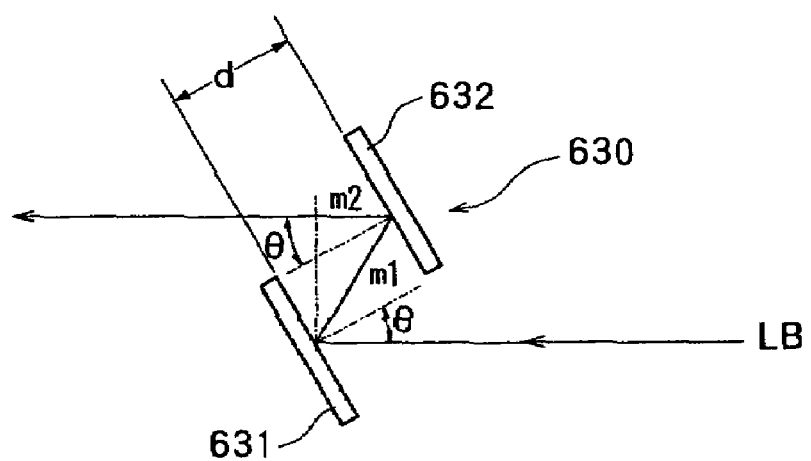
FIG. 6 is a diagram showing the length of the optical path of a laser beam passing through the first deflection mirror means shown in FIG. 5.
Figure 7:
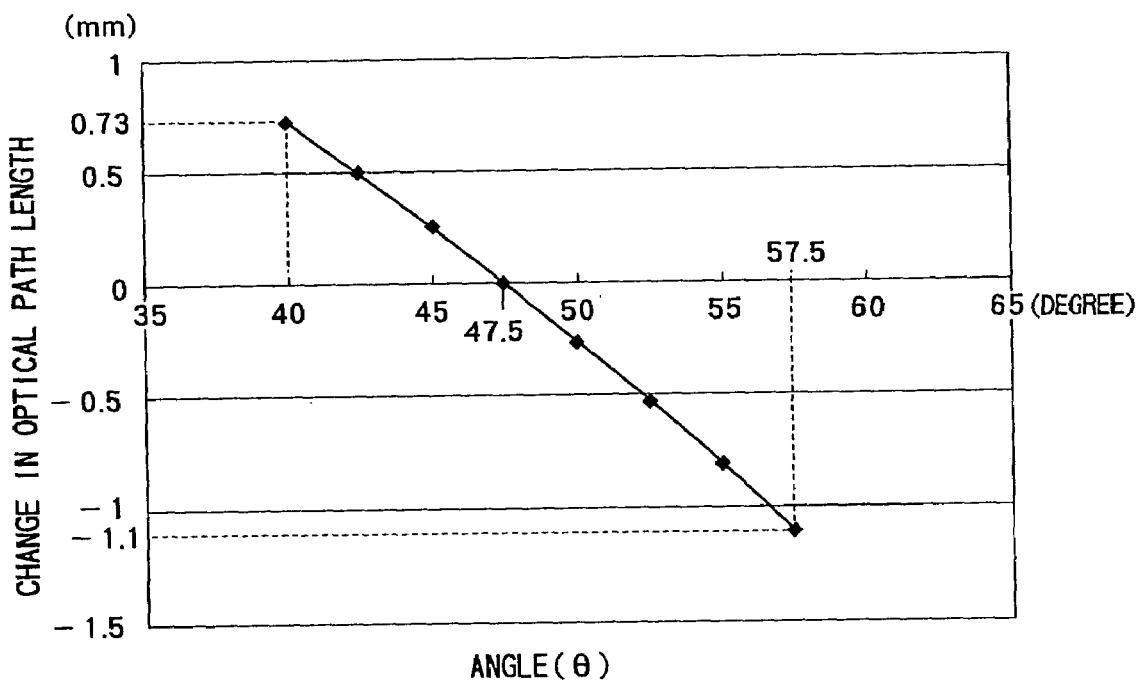
FIG. 7 is a control map showing displacement from the objective condenser lens of a condenser to the position of the focusing point based on changes in the setting angles of the first deflection mirror means and the second deflection mirror means shown in FIG. 5.

As shown in FIG. 6, when a laser beam LB is incident upon the first mirror 631 of the first deflection mirror means 630, it is reflected and deflected by the first mirror 631 and the second mirror 632. Here, when the interval between the first mirror 631 and the second mirror 632 is represented by "d", m1=d/cos θ, m2=m1 cos 2θ=(d/cos θ)cos 2θ, and therefore, m1+m2=(d/cos θ)(1+cos 2θ)=2d cos θ. Since the optical path length changing means 63 constituting the focusing point shifting means 6 in the illustrated embodiment comprises the first deflection mirror means 630 and the second deflection mirror means 640, the length of the optical path is varied by changing 2 (m1+m2). When the interval "d" between the first mirror 631 and the second mirror 632 is 2 mm, changes in the length of the optical path corresponding to the setting angles θ of the first deflection mirror means 630 and the second deflection mirror means 640 can be calculated from the above equation. When the setting angles θ of the first deflection mirror means 630 and the second deflection mirror means 640 are 47.5° as a standard value, changes in the length of the optical path are shown in FIG. 7. That is, a change in the length of the optical path becomes 1.83 mm by varying the setting angles θ of the first deflection mirror means 630 and the second deflection mirror means 640 within a range of from 40° to 57.5°.

A description will be subsequently given of the relationship between a change in the length of the optical path and a change in the position of the focusing point of a laser beam converged by the objective condenser lens 552b of the above condenser 552. In FIG. 4, when the focusing distance of the second lens 62 is represented by f1, the focusing distance of the objective condenser lens 552b is represented by f2, the focusing point of the first lens 61 is represented by Q (when a laser beam oscillated from the pulse laser beam oscillation means 54 is a parallel beam, its focusing distance becomes equal to the focusing distance of the first lens 61), the length of the optical length from the focusing point Q of the first lens 61 to the second lens 62 is represented by d1, and the length of the optical length from the second lens 62 to the objective condenser lens 552b is represented by d2, the distance d3 from the objective condenser lens 552b to the position P of the focusing point of the laser beam converged by the objective condenser lens 552b is obtained from the following equation.

$$d3 = \frac{d1 + d2 - \left(\frac{d1}{f1} + 1\right)}{\frac{1}{f2}\left\{d1 + d2\left(-\frac{d1}{f1} + 1\right)\right\} - \left(-\frac{d1}{f1} + 1\right)}$$

Figure 8:
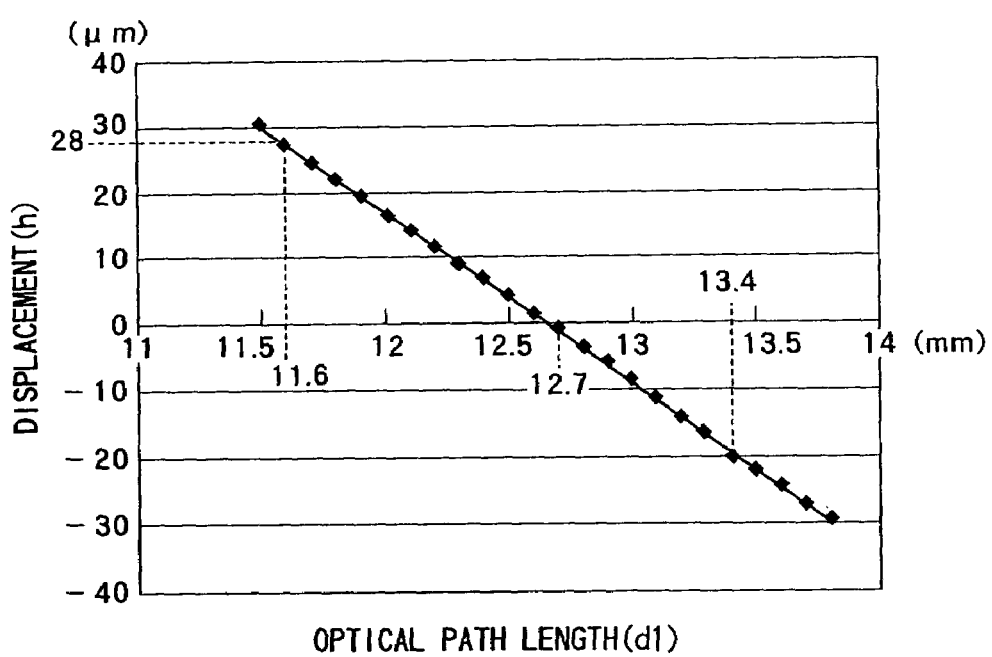
FIG. 8 is a control map showing displacement from the objective condenser lens of the condenser to the position of the focusing point based on changes in the length of the optical path of the laser beam.

Therefore, the distance d3 from the objective condenser lens 552b to the position P of the focusing point of the laser beam converged by the objective condenser lens 552b is represented by the function of the length d1 of the optical path from the focusing point Q of the first lens 61 to the second lens 62, and the position P of the focusing point of the laser beam converged by the objective condenser lens 552*b* can be changed by varying the length d1 of the optical path. Here, when the focusing distance f1 of the second lens 62 is 12.7 mm, the focusing distance f2 of the above objective condenser lens 552*b* is 2 mm, and the length d2 of the optical path from the second lens 62 to the objective condenser lens 552*b* is 20 mm, the distance d3 from the objective condenser lens 552*b* to the position P of the focusing point of the laser beam converged by the objective condenser lens 552*b* for the length d1 of the optical path from the focusing point Q of the first lens 61 to the second lens 62 is obtained from the above equation. When the length d1 of the optical path from the focusing point Q of the first lens 61 to the second lens 62 is equal to the focusing distance f1 (12.7 mm) of the second lens 62 as a standard (change is 0), a change (h) in the position P of the focusing point of a laser beam corresponding to a change in the above length d1 of the optical path is as shown in FIG. 8.

As described above, when the angles θ of the first deflection mirror means 630 and the second deflection mirror means 640 are changed from 40° to 57.5°, the length of the optical path can be changed in a range of from +0.73 mm to −1.1 mm, thereby changing the distance d3 from the objective condenser lens 552*b* to the position P of the focusing point of a laser beam converged by the objective condenser lens 552*b* in a range of from −20 μm to +28 μm.

Returning to FIG. 1, the laser beam processing machine in the illustrated embodiment has a height position detection means 7 for detecting the height position of the laser beam application area of the top surface, that is, the surface to which the laser beam is applied, of the plate-like workpiece held on the above chuck table 36. The height position detection means 7 will be described with reference to FIGS. 9 to 11.

Figure 9:
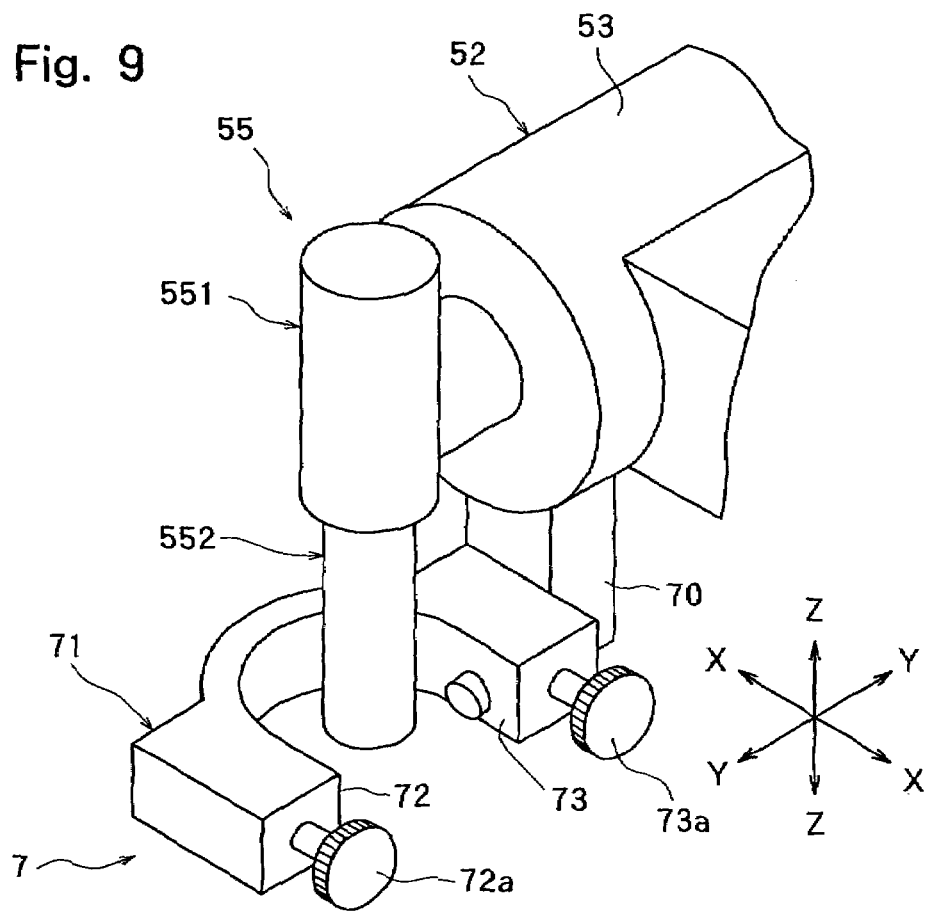
FIG. 9 is a perspective view of a processing head and a height position detection means provided in the laser beam processing machine shown in FIG. 1.
Figure 10:
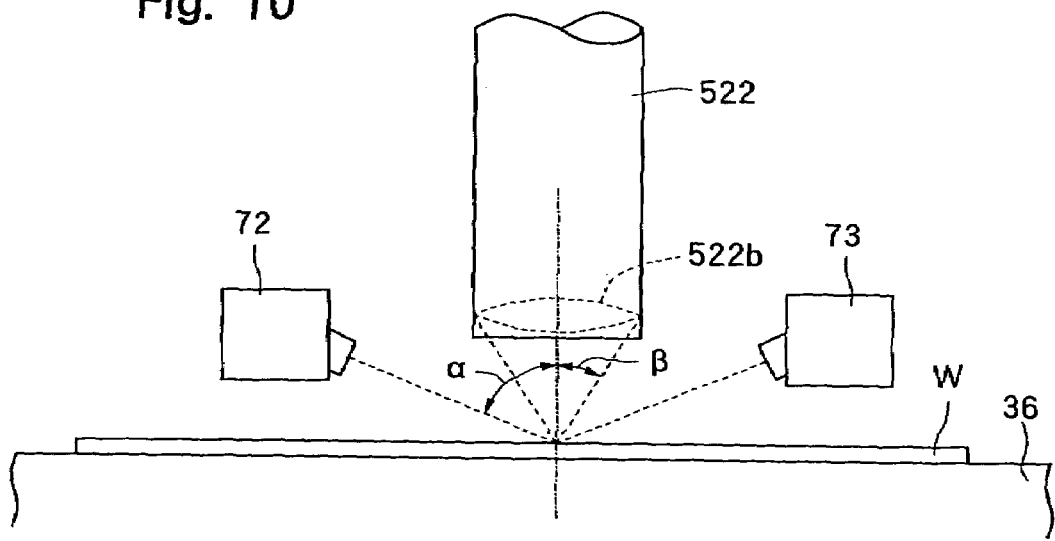
FIG. 10 is an explanatory diagram showing the positional relationship between a light-emitting means and a light-receiving means constituting the height position detection means and the condenser of the laser beam application means shown in FIG. 9.
Figure 11:
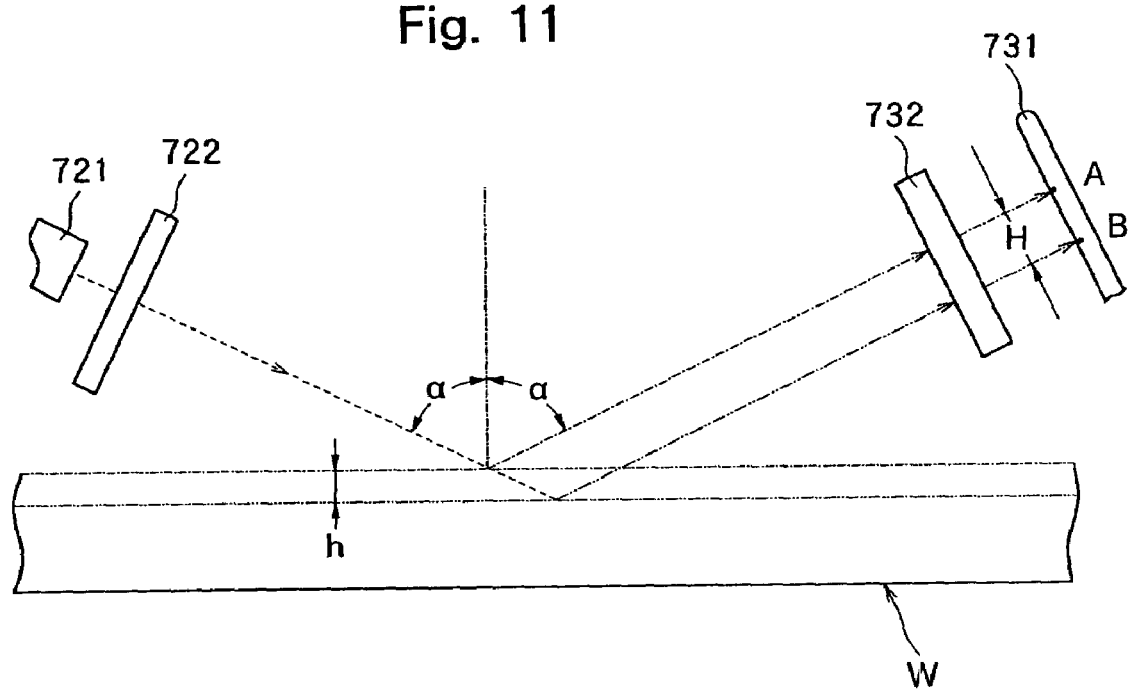
FIG. 11 is an explanatory diagram showing the detection state of the height detection means shown in FIG. 9.

The height position detection means 7 in the illustrated embodiment comprises a U-shaped frame 71 as shown in FIG. 9, and this frame 71 is fixed to the casing 53 of the above laser beam application means 52 by a support bracket 70. A light-emitting means 72 and a light-receiving means 73 are installed in the frame 71 such that they are opposed to each other in the direction indicated by the arrow Y with the above condenser 552 therebetween. The light-emitting means 72 has a light emitter 721 and a converging lens 722 as shown in FIG. 11. The light emitter 721 applies a pulse laser beam having a wavelength of, for example, 670 nm to the workpiece W held on the above chuck table 36 through the converging lens 722 at a predetermined incident angle α as shown in FIG. 10 and FIG. 11. The application position of the laser beam by the light-emitting means 72 is set to substantially correspond to the application position of a laser beam applied to the workpiece W from the condenser 552. The incident angle α is set to be larger than the converging angle β of the objective condenser lens 552*b* of the condenser 552 and smaller than 90°. The light-receiving means 73 comprises a light position detector 731 and a light receiving lens 732 and is located at a position where a laser beam applied from the above light-emitting means 72 is regularly reflected from the workpiece W. The height position detection means 7 in the illustrated embodiment comprises angle adjusting knobs 72*a* and 73*a* for adjusting the inclination angles of the above light-emitting means 72 and the light-receiving means 73, respectively. By turning the angle adjusting knobs 72*a* and 73*a*, the incident angle α of the laser beam applied from the light-emitting means 72 and the light receiving angle of the light-receiving means 73 can be adjusted, respectively.

A description will be subsequently given of the detection of the height position of the workpiece W by means of the height position detection means 7 constituted as described above, with reference to FIG. 11.

When the height position of the workpiece W is a position shown by a one-dot chain line in FIG. 11, a laser beam applied to the surface of the workpiece W from the light emitter 721 through the converging lens 722 is reflected as shown by the one-dot chain line and received at point A of the light position detector 731 through the light receiving lens 732. Meanwhile, when the height position of the workpiece W is a position shown by a two-dot chain line in FIG. 11, a laser beam applied to the surface of the workpiece W from the light emitter 721 though the converging lens 722 is reflected as shown by the two-dot chain line and received at point B of the light position detector 731 through the light receiving lens 732. Data thus received by the light position detector 731 is transmitted to a control means that will be described later. The control means calculates a displacement "h" (h=H/sin α) in the height position of the workpiece W from the interval "H" between the point A and the point B detected by the light position detector 731. Therefore, when the reference value of the height position of the workpiece W held on the above chuck table 36 is the position shown by the one-dot chain line in FIG. 11 and when the height position of the workpiece W shifts to the position shown by the two-dot chain line in FIG. 11, it is understood that the workpiece is displaced downward by the height "h".

Returning to FIG. 1, an aligning means 8 for detecting the area to be processed by the above laser beam application means 52 is installed to the front end of the casing 53 constituting the above laser beam application means 52. This aligning means 8 in the illustrated embodiment comprises an infrared illuminating means for applying infrared radiation to the workpiece, an optical system for capturing infrared radiation applied by the infrared illuminating means, and an image pick-up device (infrared CCD) for outputting an electric signal corresponding to infrared radiation captured by the optical system, in addition to an ordinary image pick-up device (CCD) for picking up an image with visible radiation. An image signal is transmitted to the control means later described.

The laser beam processing machine in the illustrated embodiment comprises a focusing point position adjusting means 57 for moving the above unit holder 51 along the pair of guide rails 423 and 423 in the direction indicated by the arrow Z, that is, the direction perpendicular to the workpiece holding surface 361 of the above chuck table 36. The focusing point position adjusting means 57 comprises a male screw rod (not shown) arranged between the pair of guide rails 423 and 423 and a drive source such as a pulse motor 572 for rotary-driving the male screw rod like the above feed means. By driving the male screw rod (not shown) in a normal direction or reverse direction with the pulse motor 572, the unit holder 51 and the laser beam application means 52 are moved along the guide rails 423 and 423 in the direction indicated by the arrow Z.

The laser beam processing machine in the illustrated embodiment comprises the control means 10. The control means 10 comprises a central processing unit (CPU) 101 for carrying out arithmetic processing based on a control program, a read-only memory (ROM) 102 for storing the control program, etc., a read/write random access memory (RAM) 103 for storing the results of operations, an input interface 104 and an output interface 105. Detection signals from the above height position detection means 7 and the aligning means 8 are input to the input interface 104 of the control means 10 constituted as described above. Control signals are output to the angle adjusting actuator 633 (ACT1) of the first deflection mirror means 630, the angle adjusting actuator 643 (ACT2) of the second deflection mirror means 640, pulse motor 372, pulse motor 382, pulse motor 432, pulse motor 572 and the laser beam application means 52 from the output interface 105. The control maps shown in FIG. 7 and FIG. 8 are stored in the above read-only memory (ROM) 102 or the random access memory (RAM) 103.

The laser beam processing machine in the illustrated embodiment is constituted as described above, and its operation will be described hereinbelow.

Figure 12:
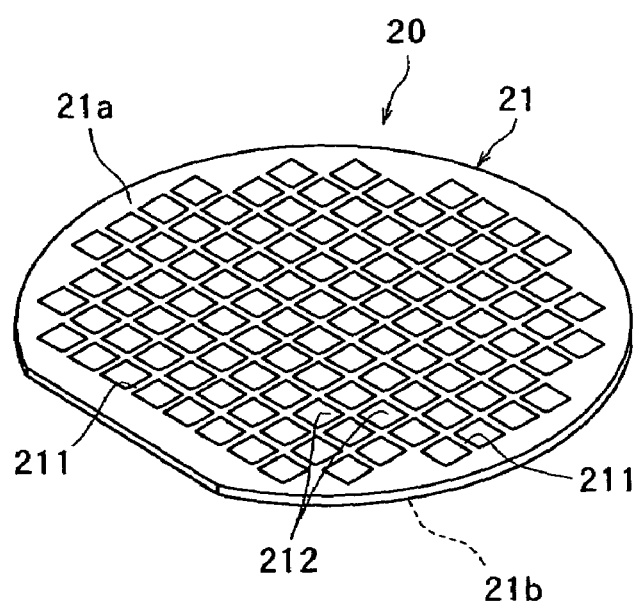
FIG. 12 is a perspective view of a semiconductor wafer as a plate-like workpiece.

FIG. 12 is a perspective view of a semiconductor wafer as the workpiece. In the semiconductor wafer 20 shown in FIG. 12, a plurality of areas are sectioned by a plurality of dividing lines (processing lines) 211 (these dividing lines are parallel to one another) arranged in a lattice pattern on the front surface 21a of a semiconductor substrate 21 formed from a silicon wafer, and a circuit 212 such as IC, LSI or the like is formed in each of the sectioned areas.

The semiconductor wafer 20 constituted as described above is carried to the top of the workpiece holding surface 361 of the chuck table 36 of the laser beam processing machine shown in FIG. 1 and suction-held on the workpiece holding surface 361 in such a manner that the back surface 21b faces up. The chuck table 36 suction-holding the semiconductor wafer 20 is moved along the guide rails 31 and 31 by the operation of the processing-feed means 37 and is brought to a position right below the aligning means 8 mounted to the laser beam application unit 5.

After the chuck table 36 is positioned right below the aligning means 8, alignment work for detecting a processing area to be processed by a laser beam, of the semiconductor wafer 20 is carried out by the aligning means 8 and the control means 10. That is, the aligning means 8 and the control means 10 carry out image processing such as pattern matching, etc. to align a dividing line 211 formed in a predetermined direction of the semiconductor wafer 20 with the condenser 552 of the laser beam application unit 5 for applying a laser beam along the dividing line 211, thereby performing the alignment of a laser beam application position. Further, the alignment of the laser beam application position is also carried out similarly on dividing lines 211 formed on the semiconductor wafer 20 in a direction perpendicular to the above predetermined direction. At this point, although the front surface 21a, on which the dividing line 211 is formed, of the semiconductor wafer 20 faces down, the dividing line 211 can be imaged from the back surface 21b as the aligning means 8 comprises infrared illuminating means, an optical system for capturing infrared radiation and an image pick-up device (infrared CCD) for outputting an electric signal corresponding to the infrared radiation, etc., as described above.

Figure 13:
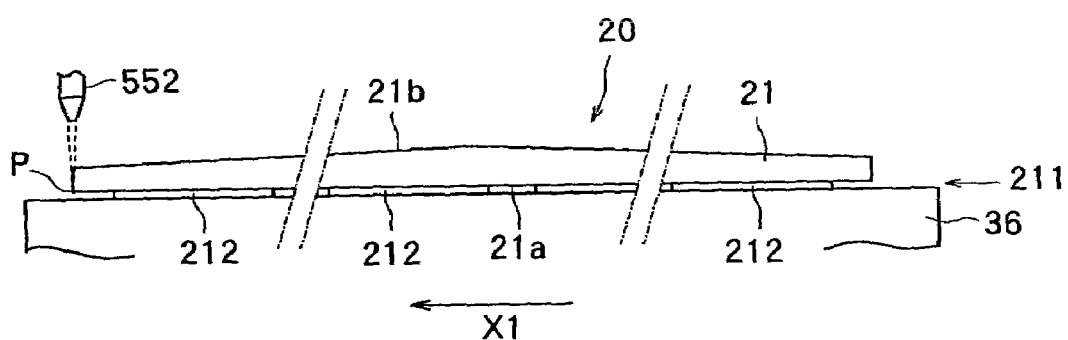
FIGS. 13(a) and 13(b) are explanatory diagrams showing the step of processing a workpiece with the laser beam processing machine shown in FIG. 1.

After the dividing line 211 formed on the semiconductor wafer 20 held on the chuck table 36 is detected and the alignment of the laser beam application position is carried out, the chuck table 36 is moved to bring one end (left end in FIG. 13(a)) of the predetermined dividing line 211 to a position right below the condenser 552 of the laser beam application means 52, as shown in FIG. 13(a). The focusing point P of a pulse laser beam applied from the condenser 552 is set near the front surface 21a (undersurface) of the semiconductor wafer 20. The chuck table 36 is then moved in the direction indicated by the arrow X1 at a predetermined processing-feed rate while the pulse laser beam is applied from the condenser 552 (processing step). When the application position of the condenser 552 reaches the other end (right end in FIG. 13(b)) of the dividing line 211 as shown in FIG. 13(b), the application of the pulse laser beam is suspended and the movement of the chuck table 36 is stopped. In this processing step, the height of the application position of the pulse laser beam applied from the condenser 552 is detected by the above height position detection means 7, and the detection signal of the height position detection means 7 is supplied to the control means 10 at all times.

Figure 15:
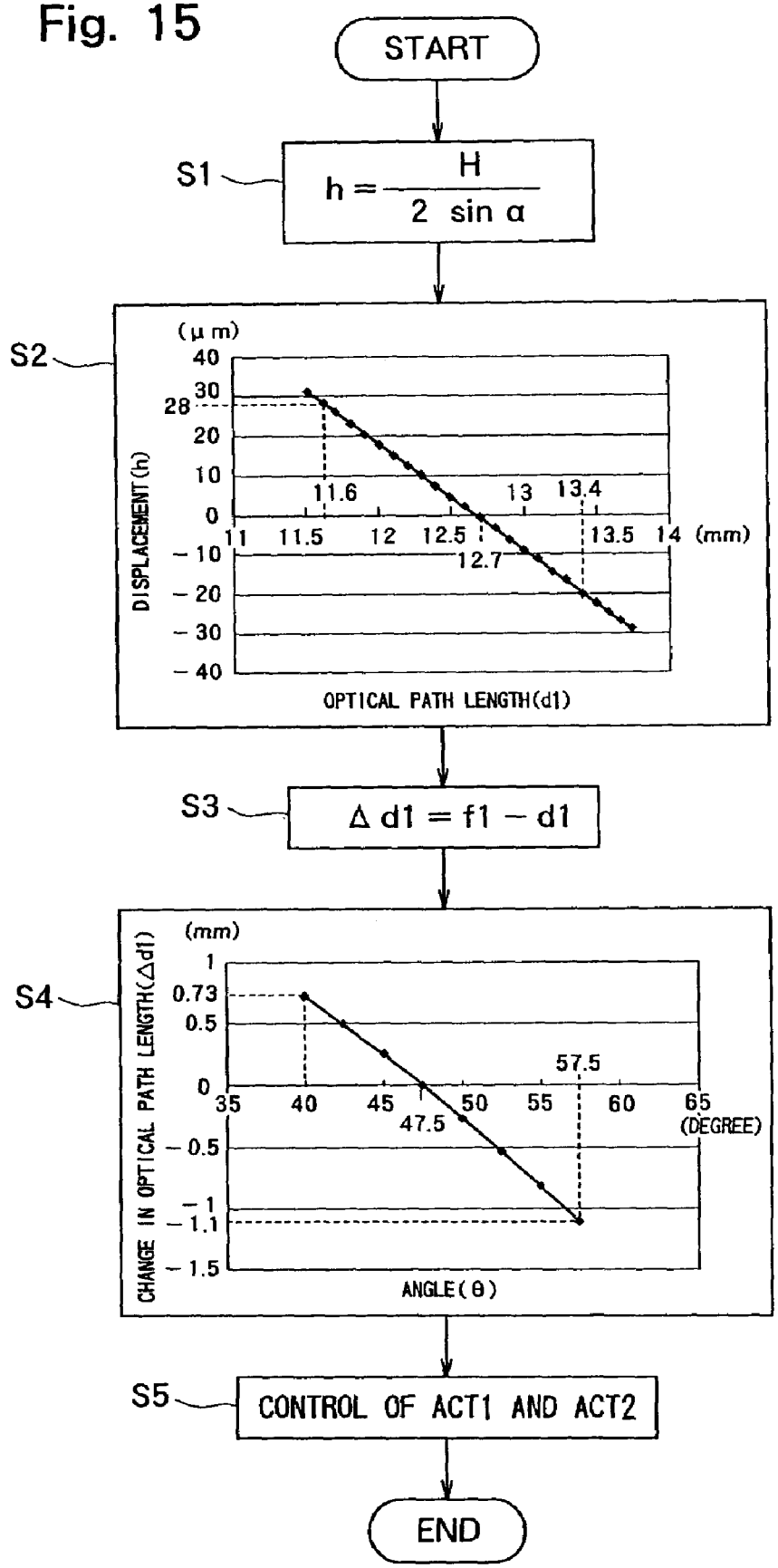
FIG. 15 is a flow chart showing the control processing procedure of a control means provided in the laser beam processing machine shown in FIG. 1.

The control procedure of the control means 10 for changing the position P of the focusing point of the laser beam converged by the objective condenser lens 552b based on the detection signal from the height position detection means 7 will be described with reference to a flow chart shown in FIG. 15.

In step S1, the control means 10 first calculates a displacement "h" ($h=H/\sin\alpha$) from the standard height position along the dividing line 211 of the semiconductor wafer 20 based on the detection signal of the height position detection means 7. Then, the control means 10 proceeds to step S2 to obtain the length d1 of the optical path from the focusing point Q of the first lens 61 to the second lens 62, which corresponds to the above displacement "h" obtained in step S1 based on the control map shown in FIG. 8. The control means 10 then proceeds to step S3 to calculate a displacement $\Delta d1$ ($\Delta d1 = f1 - d1$) between the length d1 of the optical path from the focusing point Q of the first lens 61 to the second lens 62 and the focusing distance f1 (12.7 mm in the illustrated embodiment) of the second lens 62, which corresponds to the above displacement "h" obtained in step S2. Thereafter, the control means 10 proceeds to step S4 to obtain the setting angles θ of the first deflection mirror means 630 and the second deflection mirror means 640, which corresponds to the above displacement $\Delta d1$ obtained in the above step S3 based on the control map shown in FIG. 7.

After the setting angles θ of the first deflection mirror means 630 and the second deflection mirror means 640 for the height of the application position of the pulse laser beam from the condenser 552 is obtained based on the detection signal from the height detection means 7 as described above, the control means 10 proceeds to step S5 to control the angle adjusting actuator 633 (ACT1) of the above first deflection mirror means 630 and the angle adjusting actuator 643 (ACT2) of the second deflection mirror means 640 so as to adjust the angles of the first mirror 631 and the second mirror 632 of the first deflection mirror means 630 and the third mirror 641 and the fourth mirror 642 of the second deflection mirror 640 to the setting angles θ obtained in the above step S4.

Therefore, in the above processing step, as shown in FIG. 13(b), even when the height position along the dividing line 211 of the semiconductor wafer 20 changes, the position of the condenser 552 does not change but the focusing point P of the pulse laser beam applied from the condenser 552 is set with a predetermined distance from the front surface 21a of the semiconductor wafer 20. As a result, the deteriorated layer 210 formed in the inside of the semiconductor wafer 20 is formed uniformly on the surface (i.e., on the undersurface of the semiconductor wafer 20 held on the chuck table 36) opposite to the surface to which the laser beam is applied. In the laser beam processing machine in the illustrated embodiment, the height of the application position of the pulse laser beam from the condenser 552 of the semiconductor wafer 20 held on the chuck table 36 is always detected by the height position detection means 7, and the control means controls the optical path length changing means 63 constituting the focusing point shifting means 6 based on the detection signal. Therefore, even when the semiconductor wafer 20 is not uniform in thickness, laser beam processing can be carried out at a desired position efficiently. Particularly in the illustrated embodiment, as only the setting angles θ of the first mirror 631 and the second mirror 632 of the lightweight first deflection mirror means 630 and the third mirror 641 and the fourth mirror 642 of the second deflection mirror means 640, which are all light in weight, are adjusted, the follow-up ability is high and vibration does not occur, thereby not affecting the processing accuracy.

The processing conditions in the above processing step are set as follows, for example.

Figure 14:
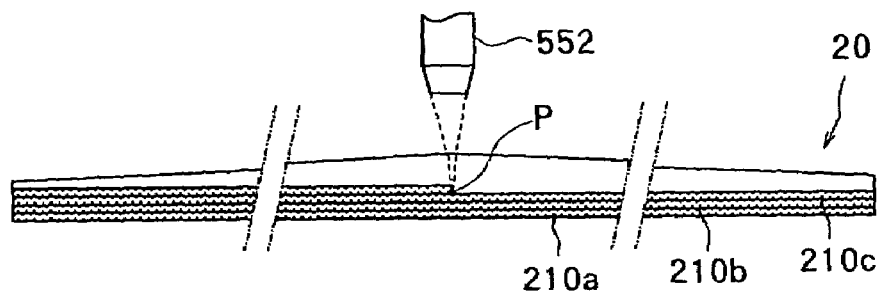
FIG. 14 is an explanatory diagram showing the processing step in a case where the workpiece is thick.

Laser: YVO4 pulse laser
Wavelength: 1,064 nm
Repetition frequency: 100 kHz
Focusing spot diameter: 1 μm
Processing-feed rate: 100 mm/sec When the semiconductor wafer 20 is thick, the above processing step is desirably carried out several times by changing the focusing point P stepwise to form a plurality of deteriorated layers 210*a*, 210*b* and 210*c* as shown in FIG. 14. As for the formation of the deteriorated layers 210*a*, 210*b* and 210*c*, the deteriorated layers 210*a*, 210*b* and 210*c* are preferably formed in this order by shifting the focusing point of the laser beam stepwise.

After the above processing step is carried out on all the dividing lines 211 extending in the predetermined direction of the semiconductor wafer 20 as described above, the chuck table 36 is turned at 90° to carry out the above processing step along dividing lines 211 extending in a direction perpendicular to the above predetermined direction. After the above processing step is thus carried out along all the dividing lines 211 formed on the semiconductor wafer 20, the chuck table 36 holding the semiconductor wafer 20 is returned to a position where it first suction-held the semiconductor wafer 20 to cancel the suction-holding of the semiconductor wafer 20. The semiconductor wafer 20 is carried to the dividing step by a conveying means that is not shown.

While a processing example in which the deteriorated layers 210 are formed in the inside of the semiconductor wafer 20 along the dividing lines 211 formed on the semiconductor wafer 20 by using the laser beam processing machine constituted according to the present invention has been described above, a groove having a predetermined depth can be formed along the front surface of the workpiece by carrying out laser beam processing for forming a groove in the front surface of the workpiece by using the laser beam processing machine of the present invention. Since the surface condition of the workpiece is changed by the formation of the groove in this processing, the detection of the height position of the workpiece by the height position detection means 7 is carried out at a position 2 to 3 mm ahead of the processing point. The processing conditions for forming a groove are set as follows, for example.

Laser: YVO4 pulse laser
Wavelength: 355 nm
Repetition frequency: 100 kHz
Focusing spot diameter: 3 μm
Processing-feed rate: 60 mm/sec A description will be subsequently given of a second embodiment of the focusing point shifting means 6 with reference to FIG. 16. In the second embodiment shown in FIG. 16, the same members as the constituent members of the focusing point shifting means 6 shown in FIG. 4 and FIG. 5 are given the same reference symbols and their detailed descriptions are omitted.

Figure 16:
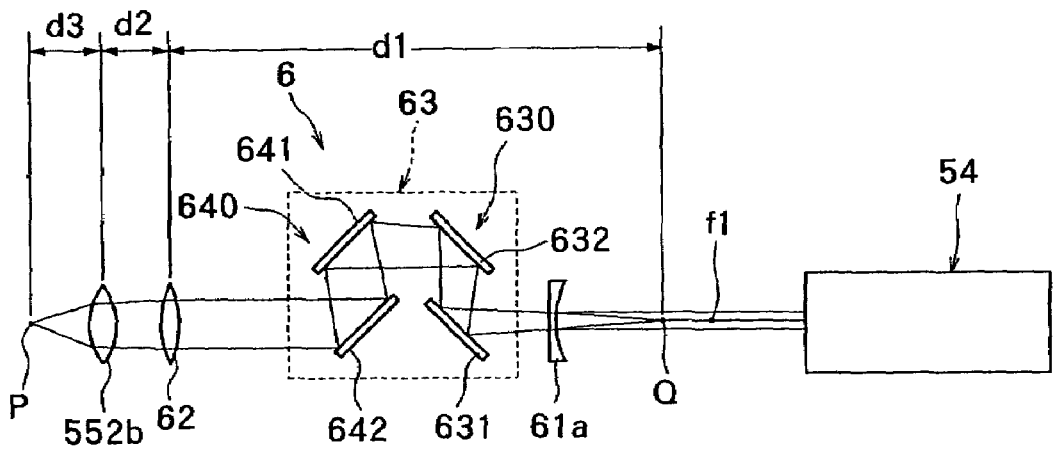
FIG. 16 is a schematic diagram of a second embodiment of the focusing point shifting means provided in the laser beam processing machine shown in FIG. 1.

The focusing point shifting means 6 of the second embodiment shown in FIG. 16 is substantially the same as the focusing point shifting means 6 shown in FIG. 4 and FIG. 5 except that a concave lens is used as a first lens 61*a*. In the focusing point shifting means 6 of the second embodiment shown in FIG. 16, the focusing point Q of the first lens 61*a* locates on the side of the pulse laser beam oscillation means 54 and the focal point f1 of the second lens 62 locates on the side near to the pulse laser beam oscillation means 54, compared with the position of the focusing point Q of the first lens 61*a*. In the thus constituted focusing point shifting means 6, the length d1 of the optical path from the focusing point Q of the first lens 61*a* to the second lens 62, the length d2 of the optical path from the second lens 62 to the objective condenser lens 552*b*, and the distance d3 from the objective condenser lens 552*b* to the position P of the focusing point of the laser beam converged by the objective condenser lens 552*b* are as shown in FIG. 16, and the distance d3 from the objective condenser lens 552*b* to the position P of the focusing point of a laser beam converged by the objective condenser lens 552*b* is obtained from the above equation.

Next, a description will be subsequently given of a third embodiment of the focusing point shifting means 6 with reference to FIG. 17. In the third embodiment shown in FIG. 17, the same members as the constituent members of the focusing point shifting means 6 shown in FIG. 4 and FIG. 5 are given the same reference symbols and their detailed descriptions are omitted.

Figure 17:
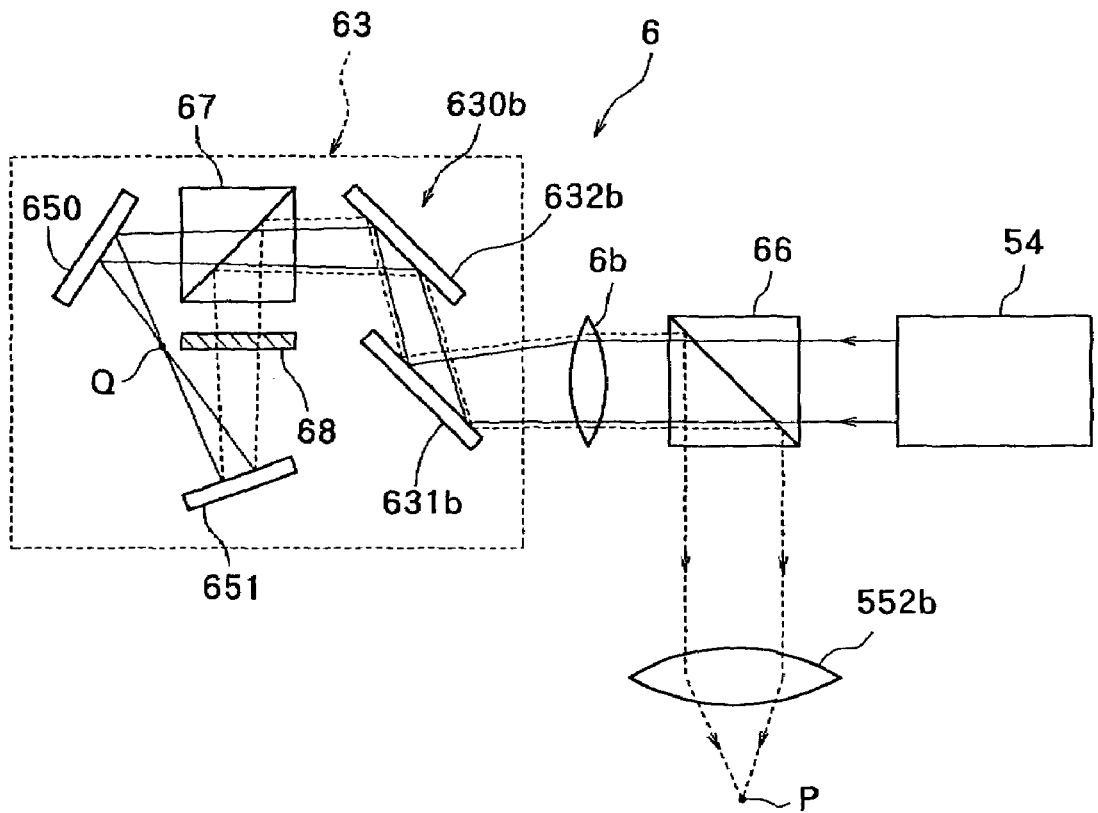
FIG. 17 is a schematic diagram of a third embodiment of the focusing point shifting means provided in the laser beam processing machine shown in FIG. 1.

In the focusing point shifting means 6 of the third embodiment shown in FIG. 17, a lens 6*b* interposed between the pulse laser beam oscillation means 54 and the optical path length changing means 63 is provided with the functions of the first lens 61 and the second lens 62 of the focusing point shifting means 6 shown in FIG. 4 and FIG. 5, and a deflection mirror means 630*b* is provided with the functions of the first deflection mirror means 630 and the second deflection mirror means 640 of the focusing point shifting means 6 shown in FIG. 4 and FIG. 5. A first deflection beam splitter 66 for reflecting P polarized light of a laser beam and transmitting only S polarized light is interposed between the pulse laser beam oscillation means 54 and the lens 6*b*, a second deflection beam splitter 67 for reflecting P polarized light of a laser beam and transmitting only S polarized light is interposed between the deflection mirror means 630*b* constituting the optical path length changing means 63 and the first reflection mirror 650, and a polarizer or a deflection plane rotor 68 such as a Faraday rotator for converting the S polarized light of a laser beam to P polarized light is interposed between a second reflection mirror 651 and the second deflection beam splitter 67.

The optical path of a laser beam oscillated from the pulse laser beam oscillation means 54 in the focusing point shifting means 6 constituted as described above will be described hereinunder. Only a vertical wave of the laser beam oscillated from the pulse laser oscillation means 54 passes through the first deflection beam splitter 66 as shown by solid lines and reaches the first mirror 631*b* of the deflection mirror means 630*b* through the lens 6*b*. The laser beam reaching the first mirror 631*b* is reflected and deflected as shown by the solid lines, further reflected and deflected by the second mirror 632*b*, reaches a first reflection mirror 650 through the second deflection beam splitter 67, is reflected and deflected by the first reflection mirror 650 and reaches the second reflection mirror 651. The laser beam reaching the second reflection mirror 651 is reflected and deflected as shown by broken lines and passes through the deflection plane rotator 68, whereby the vertical wave is changed to a transverse wave. The laser beam which has been changed to a transverse wave is reflected and deflected by the second deflection beam splitter 67 and reaches the second mirror 632*b* of the deflection mirror means 630b. The laser beam reaching the second mirror 632b is reflected and deflected as shown by the broken line, further reflected and deflected by the first mirror 631b and passes through the lens 6b. The laser beam having passed through the lens 6b is reflected and deflected by the first deflection beam splitter 66 and reaches the objective condenser lens 552b as shown by the broken lines. The laser beam reaching the objective condenser lens 552b is focused at the position P of the focusing point.

In the focusing point shifting means 6 shown in FIG. 17, the focusing point Q of the lens 6b in the optical path shown by the solid lines is in existence between the first reflection mirror 650 and the second reflection mirror 651. In the thus constituted focusing point shifting means 6, the lens 6b has the functions of the first lens 61 and the second lens 62 of the focusing point shifting means 6 shown in FIG. 4 and FIG. 5, and the deflection mirror means 630b has the functions of the first deflection mirror means 630 and the second deflection mirror means 640 of the focusing point shifting means 6 shown in FIG. 4 and FIG. 5 as described above. Therefore, in the focusing point shifting means 6 shown in FIG. 17, the length of the optical path from the above focusing point Q to the lens 6b shown by the broken lines becomes d1, the length of the optical path from the lens 6b to the objective condenser lens 552b becomes d2, and the distance from the objective condenser lens 522b to the position P of the focusing point of the laser beam converged by the objective condenser lens 552b becomes d3 which is obtained from the above equation when the focusing distance of the lens 6b is represented by f1.

What is claimed is:

1. A laser beam processing machine comprising a chuck table for holding a workpiece, a laser beam application means comprising a laser beam oscillation means and a condenser equipped with an objective lens for converging a laser beam oscillated by the laser beam oscillation means to apply it to the workpiece held on the chuck table, and a processing-feed means for moving the chuck table and the laser beam application means relative to each other in a processing-feed direction, wherein a focusing point shifting means for shifting the position of the focusing point of the laser beam converged by the objective lens is arranged between the laser beam oscillation means and the objective lens, and the focusing point shifting means comprises a first lens for transmitting the laser beam oscillated by the laser beam oscillation means, a second lens for transmitting a laser beam that has passed through the first lens, and an optical path length changing means for changing the length of an optical path between the first lens and the second lens, wherein the optical path length changing means is constituted by a first deflection mirror means which is composed of a first mirror for reflecting and deflecting a laser beam that has passed through the first lens, a second mirror, located at a predetermined interval from the first mirror, for reflecting and deflecting a laser beam reflected by the first mirror, and an angle adjusting actuator for adjusting the setting angles of the first mirror and the second mirror with respect to the first lens while maintaining the predetermined interval between the first mirror and the second mirror and a second deflection mirror means which is composed of a third mirror for reflecting and deflecting a laser beam reflected by the second mirror of the first deflection mirror means, a fourth mirror, located at a predetermined interval from the third mirror, for reflecting and deflecting a laser beam reflected by the third mirrors and an angle adjusting actuator for adjusting the setting angles of the third mirror and the fourth mirror with respect to the second mirror while maintaining the predetermined interval between the third mirror and the fourth mirror.

2. The laser beam processing machine according to claim 1 wherein the first mirror and the second mirror of the first deflection mirror means are arranged parallel to each other, and the third mirror and the fourth mirror of the second deflection mirror means are arranged parallel to each other.

3. The laser beam processing machine according to claim 1 further comprising a height position detection means for detecting the height of the application position of a laser beam applied to the top surface of the workpiece held on the chuck table and a control means for controlling the angle adjusting actuators based on a height position detection signal from the height position detection means.

* * * * *